United States Patent [19]
Seo et al.

[11] Patent Number: 5,768,174
[45] Date of Patent: Jun. 16, 1998

[54] INTEGRATED CIRCUIT MEMORY DEVICES HAVING METAL STRAPS TO IMPROVE WORD LINE DRIVER RELIABILITY

[75] Inventors: Dong-Il Seo, Kyungki-do; Hyung-Dong Kim, Seoul, both of Rep. of Korea

[73] Assignee: Samsung Electronics Co., Ltd., Suwon, Rep. of Korea

[21] Appl. No.: 761,300

[22] Filed: Dec. 6, 1996

[30] Foreign Application Priority Data

Dec. 6, 1995 [KR] Rep. of Korea ............... 1995-47101

[51] Int. Cl.$^6$ ................................................. G11C 5/06
[52] U.S. Cl. ..................... 365/63; 365/51; 365/230.03; 365/230.06
[58] Field of Search ..................... 365/63, 51, 230.06, 365/230.03

[56] References Cited

U.S. PATENT DOCUMENTS

| | | |
|---|---|---|
| 5,097,441 | 3/1992 | Cho et al. ............... 365/51 |
| 5,319,605 | 6/1994 | Min et al. ............... 365/230.06 |
| 5,455,787 | 10/1995 | Kawasima ............... 365/154 |
| 5,506,816 | 4/1996 | Hirose et al. ............... 365/230.06 |
| 5,615,156 | 3/1997 | Yoshida et al. ............... 365/200 |

Primary Examiner—David C. Nelms
Assistant Examiner—Hien Nguyen
Attorney, Agent, or Firm—Myers, Bigel, Sibley & Sajovec

[57] ABSTRACT

Integrated circuit memory devices having metal straps include an array of memory devices arranged as a plurality of sub memory blocks (SMB) in a semiconductor substrate, and a plurality of sub word line drivers (SWD) disposed between adjacent sub memory blocks in the substrate. In particular, a plurality of first signal lines at a first metal level (M1) and extending in a first direction on the array are provided. The first signal lines are directly connected to a first sub word line driver at a face of the substrate. In addition, a plurality of second signal lines are provided at a first metal level (M1) and extend in a second direction, orthogonal to the first direction, from the first sub word line driver across at least one sub memory block SMB. At least one metal strap is also provided at a second metal level (M2), above the first metal level. The metal strap preferably crosses the plurality of first signal lines and extends from a first side of the first sub word line driver to a second opposing side of the first sub word line driver. Thus, it is unnecessary to provide the first signal lines at the second metal level or provide metal segments or islands to interconnect the first signal lines to metallization at the first metal level and to the first sub word line driver. Accordingly, the memory device of the present invention can be more highly integrated and less susceptible to defects caused by bridge "shorts".

9 Claims, 4 Drawing Sheets

INTEGRATED CIRCUIT MEMORY DEVICES HAVING METAL STRAPS TO IMPROVE WORD LINE DRIVER RELIABILITY

FIELD OF THE INVENTION

The present invention relates to integrated circuit semiconductor devices, and more particularly to integrated circuit memory devices.

BACKGROUND OF THE INVENTION

In order to improve the integration densities of integrated circuit memory devices, segmented or sub word line driver structures have been employed to reduce the total area occupied by word line driver circuits. These circuits typically require boosted voltage levels (e.g., Vpp>Vcc) for proper circuit operation and the wiring associated with the voltage boosting circuits in conjunction with normal power supply wiring can be significant. Accordingly, as the ground rules for processing memory devices become more challenging, sub word line driver structures can become less reliable, particularly if large numbers of interconnect vias are employed to connect power supply and other wiring levels to the sub word line drivers.

One example of an integrated circuit memory device having sub word line driver circuits is illustrated by FIGS. 1-2. In particular, FIG. 1 is plan layout diagram of an integrated circuit memory device having an array of memory devices arranged as a plurality of sub memory blocks (SMBs) with sub word line drivers (SWDs) spaced therebetween in a word line direction WL, as illustrated. In a bit line BL direction, the SMBs are also spaced from each other by a plurality of sense amplifiers (SA). The SMBs are also spaced diagonally from each other by a conjunction region (CJ). Metal wiring is also provided at a first metal layer (M1) so that row decoding signals NWE, secondary power signals PWR and sense amplifier driver signals SIG can be transmitted between circuits in the array in the word line direction WL. Metal wiring is also provided at a second higher metal layer (M2), so that primary power signals PWR, block selection signals BLS and column selection signals CSL, for example, can be transferred between circuits in the array in the bit line direction BL.

Referring now to FIG. 2, an enlarged plan view of a sub word line driver SWD region, containing first metal layer M1 and second metal layer M2 wiring segments for transferring control signals, is illustrated. In particular, M1 lines are provided for transferring, among other things, row decoding signals (NWE), and M2 lines or segments are provided for transferring boosted voltage and ground signals VPP and VSS, internally and externally generated power supply signals VINT and VEXT and word line driver signals PXIB, PXID, PXJD and PXJB for driving and switching each sub word line driver SWD. However, because the power supply signals and word line driver signals must ultimately be provided to the driver circuits within an integrated circuit chip or substrate, metallized vias from the second metal layer M2 lines to the substrate must be provided. As illustrated, such vias 25 typically require the formation of first metal layer M1 segments or islands 11-22 as metal interconnects. Unfortunately, the use of first metal layer segments 11-22 to connect second metal layer M2 wiring to the substrate, may make the arrangement and design of first metal layer M1 wiring more difficult and decrease the first metal layer wiring density. The presence of first metal layer M1 segments or islands 11-22 may also make the likelihood of bridge defect formation greater which can result in excessive power consumption during stand-by periods because of bridge "shorts" and may even cause permanent device failure.

Thus, notwithstanding the above described attempt to form more highly integrated memory devices using sub word line drivers, there continues to be a need for memory devices with higher integration densities and reduced susceptibility to metallization defects.

SUMMARY OF THE INVENTION

It is therefore an object of the present invention to provide improved integrated circuit memory devices.

It is another object of the present invention to provide integrated circuit memory devices having higher integration densities.

It is still another object of the present invention to provide integrated circuit memory devices which are less susceptible to metallization defects and device failures caused thereby.

These and other objects, advantages and features of the present invention are provided by an integrated circuit memory device containing an array of memory devices arranged as a plurality of sub memory blocks (SMB) in a semiconductor substrate, and a plurality of sub word line drivers (SWD) disposed between adjacent sub memory blocks in the substrate. In particular, a plurality of first signal lines at a first metal level (M1) and extending in a first direction on the array are provided. The first signal lines are directly connected to a first sub word line driver at a face of the substrate. In addition, a plurality of second signal lines are provided at a first metal level (M1) and extend in a second direction, orthogonal to the first direction, from the first sub word line driver across at least one sub memory block SMB. At least one metal strap is also provided at a second metal level (M2), above the first metal level. The metal strap preferably crosses the plurality of first signal lines and extends from a first side of the first sub word line driver to a second opposing side of the first sub word line driver. Thus, it is unnecessary to provide the first signal lines at the second metal level or provide metal segments or islands to interconnect the first signal lines to metallization at the first metal level and to the first sub word line driver. Accordingly, the memory device of the present invention can be more highly integrated and less susceptible to defects caused by bridge "shorts".

DESCRIPTION OF PREFERRED EMBODIMENTS

The present invention will now be described more fully hereinafter with reference to the accompanying drawings, in which preferred embodiments of the invention are shown.

This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 2:
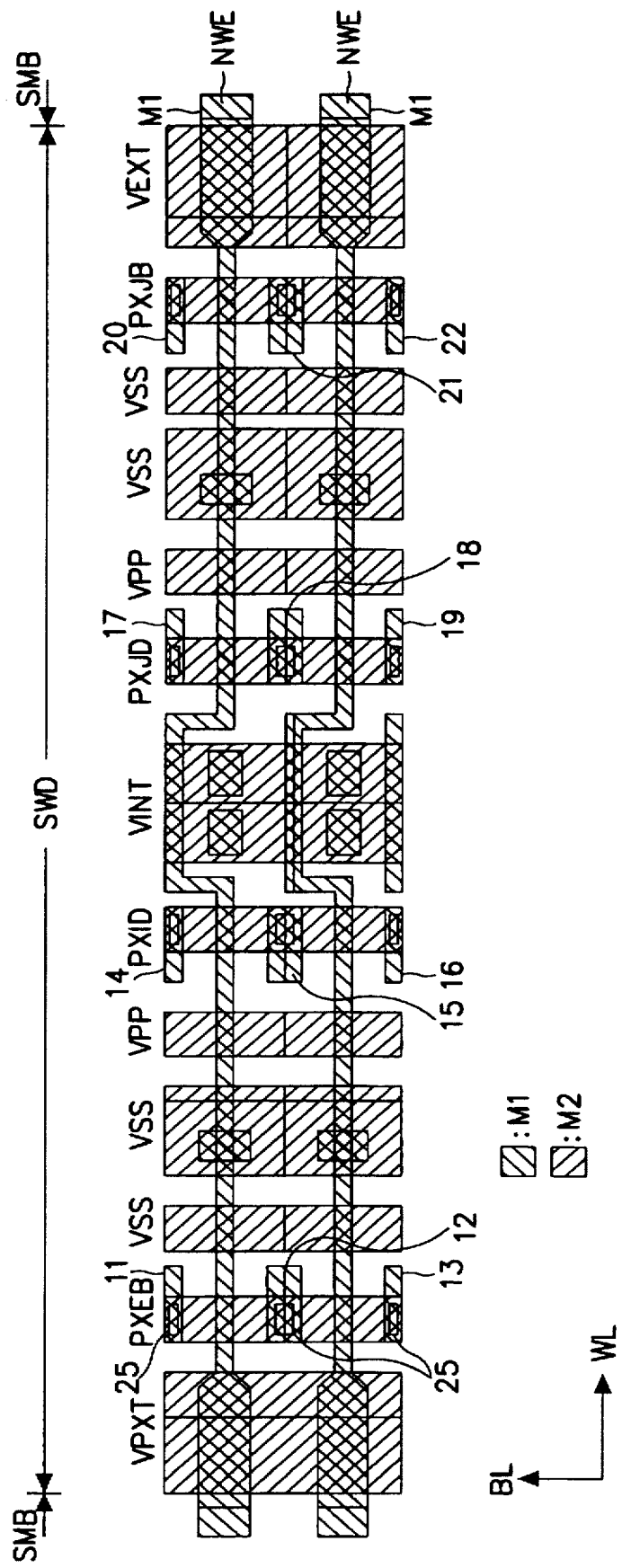
FIG. 2 is an enlarged layout schematic of first and second metal lines for provide power and control signals to a sub word line driver of FIG. 1.
Figure 3:
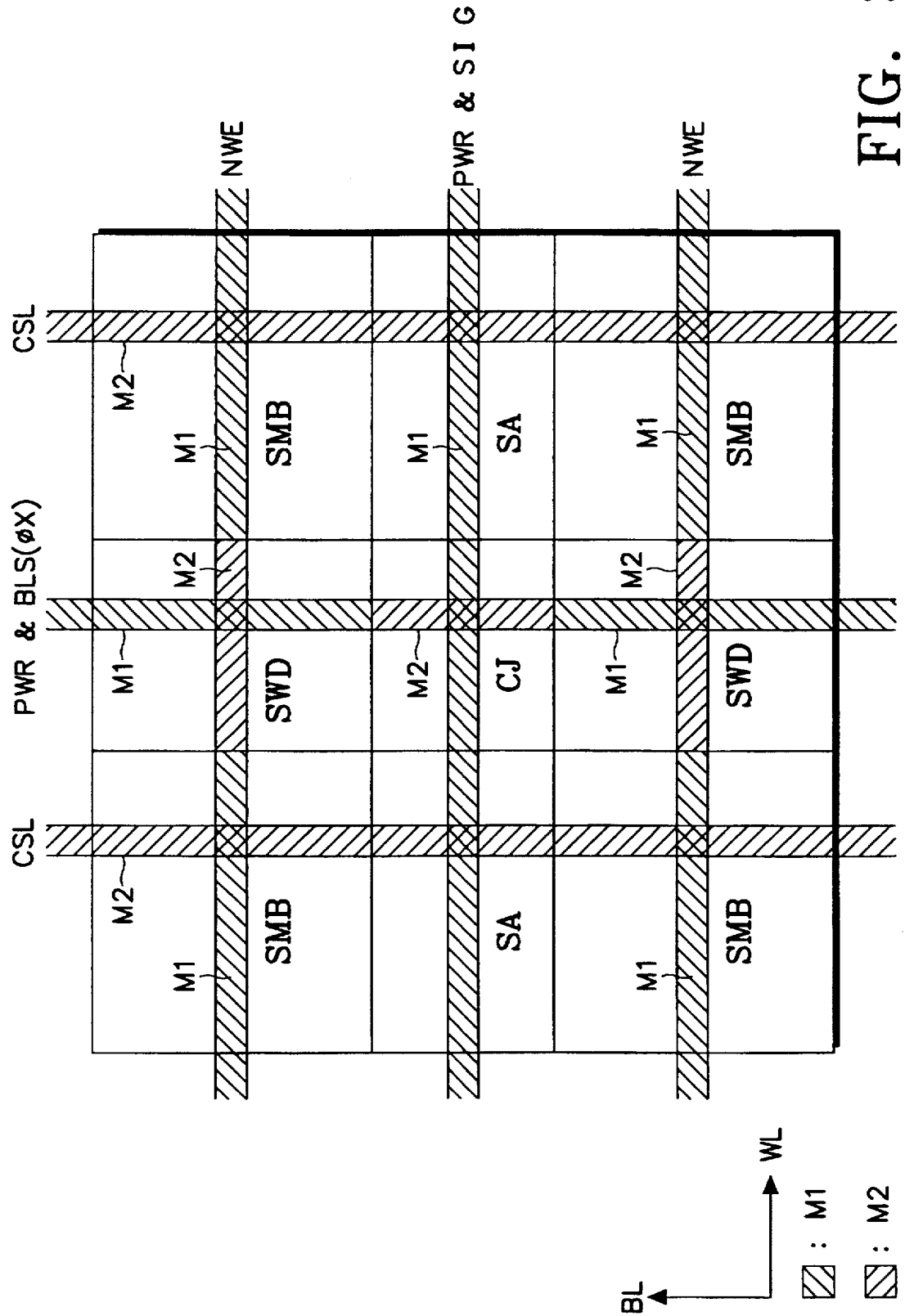
FIG. 3 is a schematic diagram showing the arrangement of metal lines in a memory array with sub word line driver structures, in accordance with an embodiment of the present invention.
Figure 4:
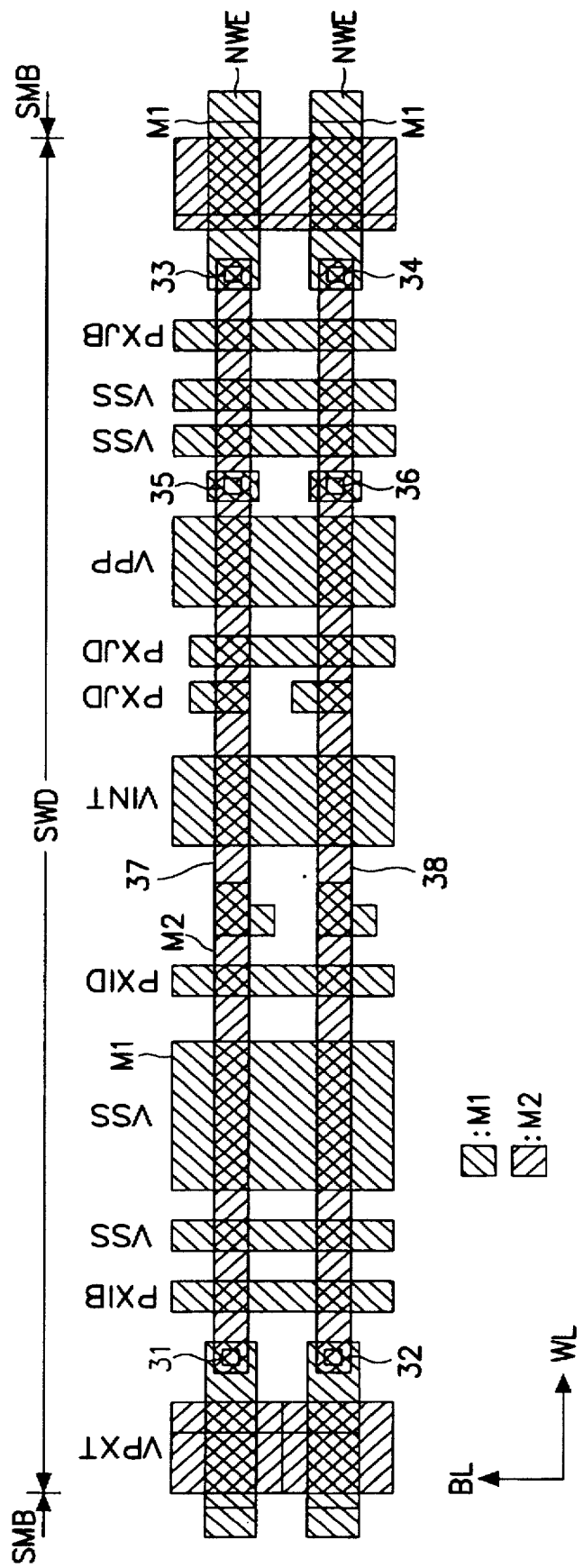
FIG. 4 is an enlarged layout schematic of first and second metal lines for provide power and control signals to a sub word line driver of FIG. 3.

Referring now to FIGS. 3–4, an integrated circuit memory device according to the present invention will now be described. In particular, an integrated circuit memory device having metal straps include an array of memory devices arranged as a plurality of sub memory blocks (SMB) in a semiconductor substrate, and a plurality of sub word line drivers (SWD) disposed between adjacent sub memory blocks in the substrate. In particular, a plurality of first signal lines (e.g., VEXT, VSS, VINT, VPP, PXIB, PXID, PXJD and PXJB) are provided at a first metal level (M1) and extend in a first bit line BL direction on the array. The first signal lines are directly connected to a first sub word line driver at a face of the substrate. In addition, a plurality of second signal lines (e.g., NWE) are provided at a first metal level (M1) and extend in a second direction, orthogonal to the first direction. The second signal lines extend from the first sub word line driver across at least one sub memory block SMB. At least one metal strap 37, 38 is also provided at a second metal level (M2), above the first metal level. The metal straps 37 and 38 preferably cross above the plurality of first signal lines and extend from a first side of the first sub word line driver to a second opposing side of the first sub word line driver. As illustrated, the metal straps 37, 38 are connected to the first metal level (M1) by vias 31–34. Other vias 35, 36 may also be provided to connect the row decoding signal lines to the sub word driver. Thus, it is unnecessary to provide the first signal lines at the second metal level or provide metal segments or islands to interconnect the first signal lines to metallization at the first metal level and to the first sub word line driver in the substrate, as required by the device of FIGS. 1–2. Accordingly, the memory device of the present invention can be more highly integrated and less susceptible to defects caused by bridge "shorts".

In particular, FIG. 3 is plan layout diagram of an integrated circuit memory device having an array of memory devices arranged as a plurality of sub memory blocks (SMBs) with sub word line drivers (SWDs) spaced therebetween in a word line direction WL, as illustrated. In a bit line BL direction, the SMBs are also spaced from each other by a plurality of sense amplifiers (SA). The SMBs are also spaced diagonally from each other by a conjunction region (CJ). Metal wiring is also provided at a first metal layer (M1) so that row decoding signals NWE, secondary power signals PWR and sense amplifier driver signals SIG can be transmitted between circuits in the array in the word line direction WL. Metal wiring is also provided at the first metal layer (M1), so that primary power signals PWR and block selection signals BLS can be transferred between circuits in the array in the bit line BL direction. In addition, metal wiring is also provided at the second metal layer (M2) so that column selection signals CSL, for example, can be transferred between circuits in the array in the bit line direction BL.

Figure 1:
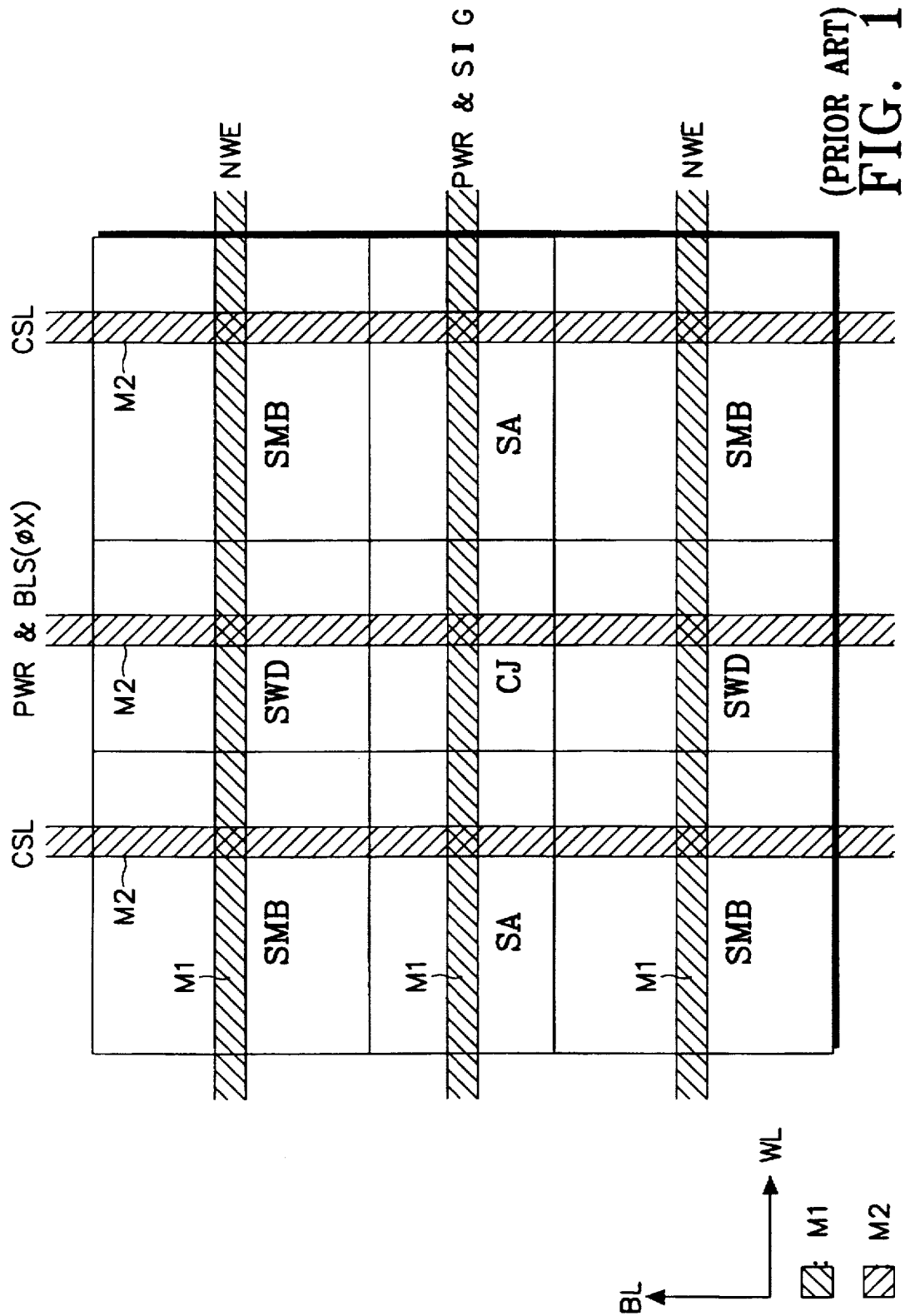
FIG. 1 is a schematic diagram showing the arrangement of metal lines in a memory array with sub word line driver structures, in accordance with the conventional method.

Referring now to FIG. 4, an enlarged plan view of a sub word line driver SWD region, containing first metal layer M1 wiring for transferring control signals and second metal straps 37, 38 for connecting first metal layer M1 wiring at opposing sides of each sub word line driver circuit, is illustrated. In particular, M1 lines are provided for transferring, among other things, row decoding signals (NWE), boosted voltage and ground signals VPP and VSS, internally and externally generated power supply signals VINT and VEXT and word line driver signals PXID, PXJD and PXJB for driving and switching each sub word line driver SWD. The second metal straps 37, 38 eliminate the need to provide the power supply and word line driver signals at the second metal M2 wiring layer and eliminate most of the need to form vias 25 or metal layer M1 segments or islands 11–22 as metal interconnects, as illustrated by FIG. 2. Thus, the limitation associated with the device of FIGS. 1–2 are typically not experienced with the device of the present invention.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device containing an array of memory devices arranged as a plurality of sub memory blocks in a semiconductor substrate, and a plurality of sub word line drivers disposed between adjacent sub memory blocks in the substrate, comprising:

a plurality of first signal lines at a first metal level and extending in a first direction on the array, said plurality of first signal lines connected to a first sub word line driver in the plurality thereof at a face of the substrate;

a plurality of second signal lines at a first metal level and extending in a second direction, orthogonal to the first direction, and extending opposite a sub memory block which is disposed adjacent the first sub word line driver; and at least one metal strap at a second metal level, above the first metal level and crossing said plurality of first signal lines, said at least one strap extending from a first side of the first sub word line driver to a second opposing side of the first sub word line driver.

2. The memory device of claim 1, wherein at least one of said plurality of second signal lines comprises a row decoding signal line.

3. The memory device of claim 2, wherein one of said plurality of first signal lines comprises a power signal line and another of said plurality of first signal lines comprises a boosted voltage signal line.

4. A semiconductor memory device having a plurality of sub word line driver regions arranged in a first direction in each space between a plurality of sub memory blocks, a plurality of sense amplifier regions arranged in a second direction in each space between the sub memory blocks, and a plurality of conjunction regions arranged in the first direction in each space between the sense amplifier regions, said semiconductor memory device comprising:

first metal line layers divided into a plurality of lines, said first metal line layers extending in said first direction on said sub memory blocks to transmit a row decoding signal and extending in said second direction on said sub word line driver regions to transmit a power supply signal and a block selection information signal; and second metal line layers divided into a plurality of lines, said second metal line layers extending in said first direction on said sub word line driver regions to transmit said row decoding signal and extending in said second direction on said conjunction regions to transmit said power supply signal and said block selection information signal.

5. The device of claim 4, wherein said first metal line layers are located lower than said second metal line layers.

6. The device of claim 4, wherein each of said first metal line layers which extend in said first direction is electrically connected to a respective second metal line layer which extends in said first direction.

7. The device of claim 4, wherein each of said first metal line layers which extend in said second direction is electrically connected to a respective second metal line layer which extends in said second direction.

8. The device of claim 4, wherein said second metal line layers extend in said second direction on said sub memory blocks and said sense amplifier regions to transmit a column selection signal.

9. The device of claim 4, wherein said first metal line layers extend in said first direction on said conjunction regions and said sense amplifier regions to transmit a power supply signal.

* * * * *